(12) United States Patent
Abadir et al.

(10) Patent No.: US 7,650,579 B2
(45) Date of Patent: Jan. 19, 2010

(54) MODEL CORRESPONDENCE METHOD AND DEVICE

(75) Inventors: Magdy S. Abadir, Austin, TX (US);
Himyanshu Anand, Austin, TX (US);
M. Alper Sen, Austin, TX (US); Jayanta Bhadra, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 327 days.

(21) Appl. No.: 11/441,367

(22) Filed: May 25, 2006

(65) Prior Publication Data

US 2007/0277133 A1    Nov. 29, 2007

(51) Int. Cl.
*G06F 17/50*    (2006.01)
(52) U.S. Cl. ............................. 716/5; 716/1
(58) Field of Classification Search ............... 716/4–6, 716/1
See application file for complete search history.

(56) References Cited

U.S. PATENT DOCUMENTS

| | | | |
|---|---|---|---|
| 5,638,381 A | | 6/1997 | Cho et al. |
| 6,163,876 A | * | 12/2000 | Ashar et al. ............ 716/5 |
| 6,336,206 B1 | * | 1/2002 | Lockyear .............. 716/7 |
| 6,560,758 B1 | * | 5/2003 | Jain .................... 716/7 |
| 7,017,043 B1 | * | 3/2006 | Potkonjak ............ 713/176 |
| 7,246,334 B1 | * | 7/2007 | Dastidar et al. ......... 716/4 |

OTHER PUBLICATIONS

Anand et al, "Establishing Latch Correspondence for Embedded Circuits of PowerPC Microprocessors" IEEE, 2005, pp. 37-44.*

Abadir et al., "An Improved Layout Verification Algorithm (LAVA)," MCC CAD Program, Austin, Texas, IEEE 1990, pp. 391-395.
Anand et al., "Establishing Latch Correspondence for Embedded Circuits of PowerPC Microprocessors," Freescale Semiconductor, Inc., Austin, Texas, 8 pages.
Anastasakis et al., "A Practical and Efficient Method for Compare-Point Matching," Synopsys, Inc., DAC Jun. 10-14, 2002, New Orleans, LA, 6 pages.
Burch et al., "Robust Latch Mapping for Combinational Equivalence Checking," Cadence Berkeley Labs, 7 pages.
Ng et al., "Solving the Latch Mapping Problem in an Industrial Setting," DAC Jun. 2-6, 2003, Anaheim, CA, pp. 442-447.
Van Eijk et al., "Detection of Equivalent State Variables in Finite State Machine Verification," Eindhoven University of Technology, Department of Electrical Engineering, 10 pages.

* cited by examiner

*Primary Examiner*—Matthew Smith
*Assistant Examiner*—Binh C Tat

(57) ABSTRACT

A method and device for determining memory element and intermediate point correspondences between design models is disclosed. The method includes developing graph representations of two circuit design models of an electronic device. The circuit design models each include input and output nodes corresponding to input and output nodes of the electronic device. The circuit design models also include memory and intermediate nodes corresponding to memory elements and intermediate points, respectively of the electronic device. An intermediate point represents a point between memory elements of the electronic device, and so can represent logic gates or other modules of the device. Memory elements and intermediate points can be referred to collectively as circuit elements. Nodes in the graph representation represent inputs, outputs, memory elements or intermediate points in the design models. A correspondence between the circuit elements in circuit design models is determined based on the graph representations.

18 Claims, 3 Drawing Sheets

MODEL CORRESPONDENCE METHOD AND DEVICE

FIELD OF THE DISCLOSURE

The present disclosure relates to methods and devices for determining correspondence between different circuit design models of an electronic circuit, and more particularly for determining memory element correspondence between the design models.

BACKGROUND

Modern electronic devices can be very complex, including hundreds of thousands or more logic gates, memory elements, and other components. In order to simplify the design of these devices, circuit design models are sometimes created. These circuit design models include representations of the electronic device components, or portions thereof. In addition, multiple circuit design models for the device are typically created during the design process. It is sometimes desirable to determine whether multiple design models are equivalent to each other, to ensure that the design models are representing the same device design. In order to prove equivalence of the multiple design models, it is sometimes desirable to determine correspondence for memory elements or intermediate points between multiple designs. However, because of the complexity of the device, and the complexity of the design models, it can be difficult to determine memory element and intermediate point correspondence between the design models using conventional techniques.

Therefore, it is desirable to provide an improved technique for determining correspondence between different circuit design models of an electronic device.

DESCRIPTION OF THE DRAWINGS

A method and device for determining memory element and intermediate point correspondences between design models is disclosed. The method includes developing graph representations of two circuit design models of an electronic device. The circuit design models each include input and output nodes corresponding to input and output nodes of the electronic device. The circuit design models also include memory and intermediate nodes corresponding to memory elements and intermediate points, respectively of the electronic device. An intermediate point represents a point between memory elements of the electronic device, and so can represent logic gates or other modules of the device. Memory elements and intermediate points can be referred to collectively as circuit elements. Nodes in the graph representation represent inputs, outputs, memory elements or intermediate points in the design models. A correspondence between the circuit elements in circuit design models is determined based on the graph representations. In a particular embodiment, the correspondence is determined by associating labels to the input and output nodes, and determining labels for the nodes based on the labels for the input and output nodes.

Figure 1:
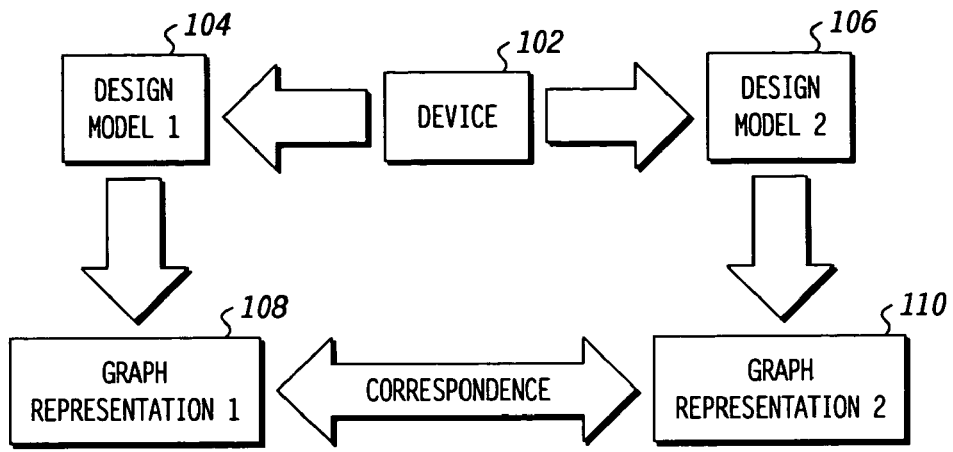
FIG. 1 is a diagram of a particular embodiment of a method of determining memory element and intermediate point correspondence between two design models.

Referring to FIG. 1, a diagram of a particular embodiment of a method of determining circuit element (memory element or intermediate point) correspondence between two design models is illustrated. The diagram illustrates an electronic device 102. The diagram further illustrates a first circuit design model 104 and a second circuit design model 106. Each design model is based on the device 102. The design models 104 and 106 can be Register Transfer Level (RTL) models, transistor circuit level (TCL) models, or other appropriate models. The design models 104 and 106 can be different types of design models. For example, in a particular embodiment the first design model 104 is an RTL model and the second design model 106 is a TCL model. The diagram also illustrates a graph representation 108 based on the first circuit design model 104, and a graph representation 110 based on the second circuit design model 106.

The graph representations 108 and 110 are created based on their associated circuit design models, and can be created via software, hardware, or other appropriate method. Further, the graph representations 108 and 110 can be created so that each graph representation includes a set of nodes corresponding to input and output nodes of the associated design model. In addition, the graph representations 108 and 110 can include memory element nodes to correspond to memory elements of the associated design model. Similarly other intermediate points from the circuit design can be included in the graph representations. A nodes of the graph representation 108 and the graph representation 110 can also be referred to as a vertex of the graph representation.

After the graph representations 108 and 110 are created, the graph representations can be analyzed to find correspondences between circuit elements of the graph representations. For example, the memory element nodes of the graph representations 108 and 110 can be analyzed to find which memory elements of the first circuit design model 104 correspond with which memory elements of the second design model 106. The results of this analysis can be used to refine the design models 104 and 106, as well as identify design errors. For example, if the correspondence analysis determines that one of the memory elements of the second design model 106 does not correspond to any memory element in the first design model 104, then one of the design models likely includes an error. Further analysis of the design module 104 and 106 can be performed to locate the error.

Figure 2:
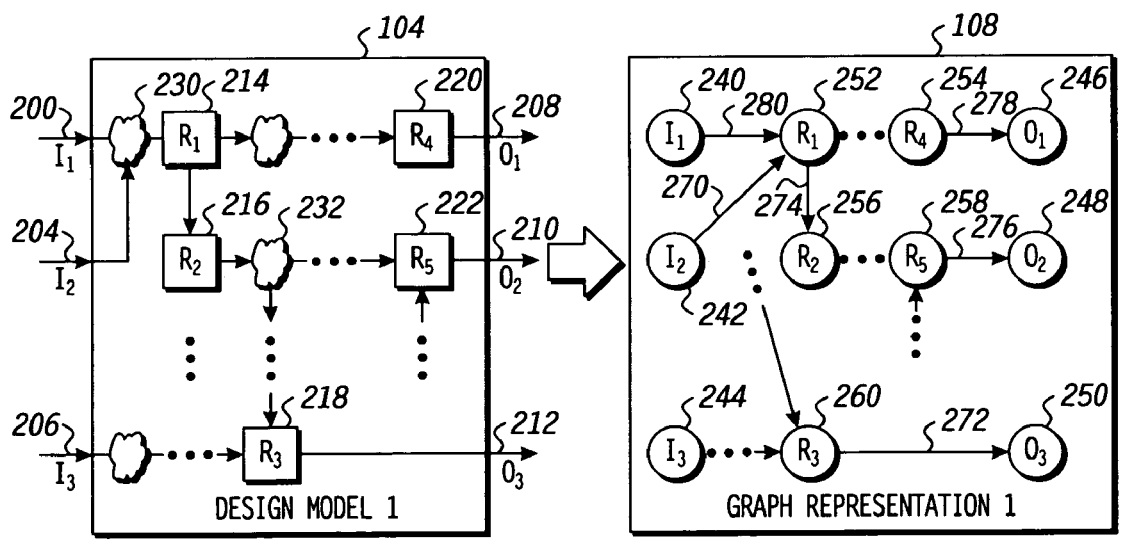
FIG. 2 is a diagram illustrating a particular embodiment of a method of creating a graph representation of the design models of FIG. 1.

Referring to FIG. 2, a diagram of a particular embodiment of a method of creating a graph representation is illustrated. The diagram illustrates the first circuit design model of FIG. 1 and the corresponding first graph representation 108. The first circuit design model includes a plurality of input nodes, including a first input node 200, a second input node 204, and a third input node 206, and a plurality of output nodes, including a first output node 208, a second output node 210, and a third output node 212. In addition, the first circuit design model 104 includes a plurality of memory elements, including memory elements 214, 216, and 218 (memory elements 214-218), and further includes a plurality of intermediate points, including intermediate points 220 and 222. The circuit design model also includes logic modules, such as logic module 230 and logic module 232. As illustrated, the logic modules can be located between the input and output nodes and the memory elements, and can also be located between memory elements or between memory elements and intermediate points.

The graph representation 108 includes a plurality of input nodes, including input nodes 240, 242, and 244, and a plurality of output nodes 246, 248, and 250. The graph representation 108 also includes a plurality of memory element nodes, such as the memory element nodes 252, 256, and 260 and a plurality of intermediate nodes, such as intermediate nodes 254 and 258. Further, the graph representation 108 includes a plurality of connections, or edges, between memory element nodes, such as edges 270, 272, 274, 276, 278, and 280.

The first circuit design model 104 is representative of an electronic device, such as the electronic device 102 of FIG. 1. Accordingly, the input and output nodes, such as input node 200 and output node 208, correspond to inputs and outputs of the electronic device 102. Similarly, the memory elements of the first circuit design model 104, such as memory elements 214 and 216, correspond to memory elements of the device 102. The memory elements can be latches, flip-flops, or other memory element. Similarly the intermediate points, such as intermediate points 220 and 222, the intermediate points correspond to intermediate points of the device 102. In addition, the logic modules of the circuit design model 104 represent corresponding logic modules of the electronic device 102.

To create the graph representation 108, the input nodes 240, 242, and 244 are created to correspond to the input nodes 200, 204, and 206, respectively, of the circuit design model 104. Similarly, the output nodes 246, 248, and 250 are created to correspond to the output nodes 208, 210, and 212 of the circuit design model 104. In addition, the memory element nodes 252, 256, and 260 of the graph representation 108 are created to correspond to the memory elements 214-218 of the circuit design model 104. For example, the memory element node 252 is created to correspond to the memory element 214, while the memory element 256 is created to correspond to the memory element 216. Further, the intermediate nodes 254 and 258 are created to correspond to the intermediate points 220 and 220, respectively, of the circuit design model 104.

As illustrated, in a particular embodiment the graph representation 108 does not include logic nodes or other elements to correspond to all of the logic modules, such as logic modules 230 and 232, of the circuit design model 104. Instead, edges are created and placed between memory element, input, output or intermediate point nodes of the graph representation 108 to represent the logic modules that link the memory elements, inputs, outputs or intermediate points of the first circuit design model 104. These edges can represent the logic pathways between nodes without representing the logic itself. For example, the edge 270 is created to indicate that the memory element 214 is responsive to the input 204, while the edge 272 is created to indicate that the output 212 is responsive to the memory element 218. Other edges are created to indicate that some memory elements are responsive to other memory elements or intermediate points.

By creating the graph representation 108 without representing every logic module, or the individual gates of every logic module, the graph representation 108 is simplified. This can improve the ability to find correspondences between graph representations, and therefore between circuit design models. In addition, by omitting representation of logic modules and logic gates, the ability to locate correspondence between memory elements and intermediate points is enhanced.

Figure 3:
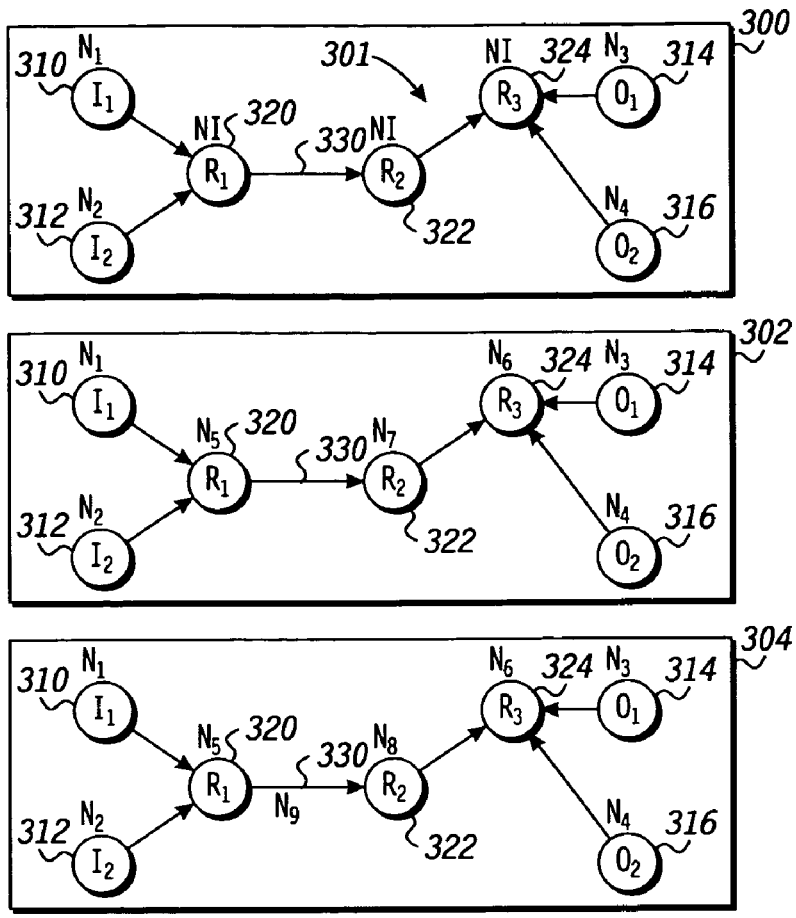
FIG. 3 is a diagram of a particular embodiment of a method of calculating labels for the graph representations of FIG. 1.

Referring to FIG. 3, a diagram of a particular embodiment of a method of calculating labels for graph representations is illustrated. The diagram illustrates three separate iterations, including a first iteration 300, a second iteration 302, and a third iteration 304, of a graph representation 301 of a circuit design model. The graph representation 301 includes input nodes 310 and 312 and output nodes 314 and 316. The graph representation 301 also includes memory element nodes 320 and 324, and an intermediate node 322. In addition, the graph representation 301 includes a number of edges between the memory element nodes, such as edges 330, 332, 334, 335, 336, and 338.

To determine labels for each of the memory element nodes 320 and 322, and the intermediate node 324, labels N1, N2, N3 and N4 are assigned to the input nodes 310, the input node 312, the output node 314 and the output node 316, respectively. Labels can typically be assigned to input and output nodes when correspondences between the input and output nodes of different circuit design models are known. In a particular embodiment, each label assigned to the input and output node is a unique value. In another particular embodiment, each label assigned to the input and output nodes is a prime number, to improve the likelihood that unique labels may be developed for the memory element nodes. In still another particular embodiment, the prime numbers chosen are large prime numbers, to enhance the likelihood that the labels determined for the memory element nodes 320 and 322 and the intermediate node 324 are unique values. In addition, initial labels (NI) are assigned to the nodes 320, 322, and 324.

As illustrated by iteration 302, a mathematical operation can be performed on the labels for the input and output nodes, as well as the values of linked nodes to determine a label for each node. For example, the memory element labels N5 is calculated for the memory element node 320 based on the values of the input node 310, the input node 312 and the memory element node 322. The memory element label N7 can be calculated based on the values associated with the node 320 and the node 324.

A memory element label can be calculated based on the values of the nodes linked to the memory element node via edges. For example, because the memory element label N7 associated with the node 322 is based on the initial labels N1 for the node 320 and the node 324, it is unlikely that the label will uniquely identify the node. Accordingly, at iteration 304 a second label N8 is calculated for the node 322 based on the memory element labels N5 and N6.

Further, weights can be assigned to edges between memory element nodes, in order to determine a memory element label. For example, the memory element label N8 associated with the memory element node 322 can be based on the edge weight N9 associated with the edge 330. Weights for the edge 330 can be assigned based on the direction of dependency of the nodes. For example, if a node n1 depends on a node n2, then weight associated with the edge between the nodes (denoted as edge (n1,n2), indicating that the node n2 is dependent on the node n1) can be w(n1,n2)=2. In contrast, the weight associated with edge (n2,n1) can be w(n2,n1)=1. This manner of associating weights assigns a higher weight to a logic dependency. In another embodiment edges may be assigned the same weights. In still another embodiment different weights might be assigned to edges depending upon other criteria. Also, user specified weights might be assigned to some specific edges.

It will be apparent that many different formulas can be used to calculate graph labels. In a particular embodiment, the following formula is used:

$$f = \Sigma w(u,v) * N_i(u) + \Sigma w(v,x) * N_i(x)$$

where f is the label to be determined for node 'v', $N_i(u)$ and $N_i(x)$ are the labels for the input nodes, output nodes, intermediate points or memory element nodes connected to the node 'v', and w(u,v) and w(v,x) are edge weights for the edges connected to the node 'v'. Node 'v' can be an input, output, memory element or an intermediate point.

As illustrated, the process of finding labels can be performed iteratively, so that the process is repeated as new labels are located. The labels can then be used to determine correspondences between circuit design models. In addition, after each iteration of finding labels, the current set of labels can be compared to a previous set of labels. If the comparison indicates that there is a match between the current set of labels and the previous set of labels, this can indicate that no new unique labels will be found. Accordingly, the process may be stopped. In a particular embodiment, the process is stopped after a predetermined number of matches between label iterations are detected.

Figure 4:
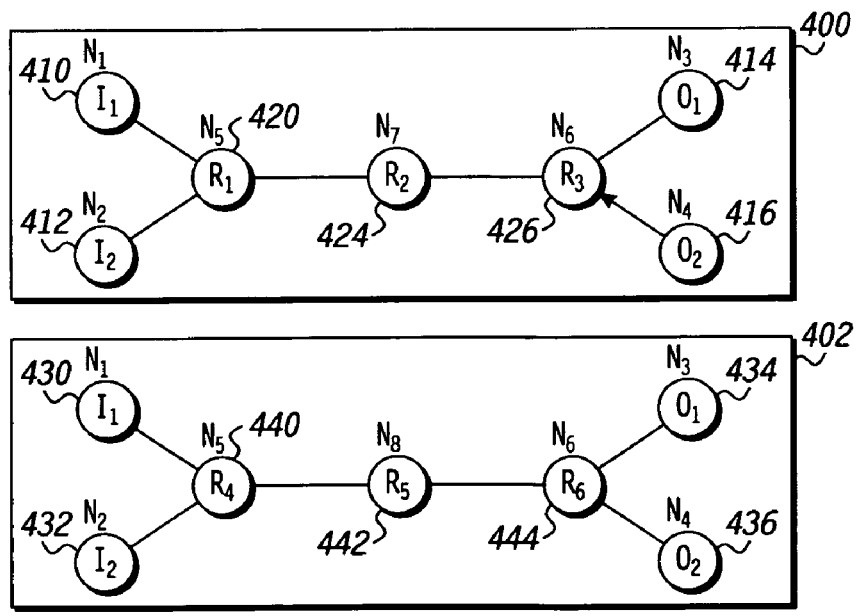
FIG. 4 is a diagram of a particular embodiment of a method of determining memory element and intermediate point correspondences between the graph representations of FIG. 1.

Referring to FIG. 4, a particular embodiment of a method of identifying correspondences between memory elements of circuit design models is illustrated. FIG. 4 illustrates a first graph representation 400, based on a first circuit design model, and a second graph representation 402, based on a second circuit design model. The first graph representation 400 includes input nodes 410 and 412 and output nodes 414 and 416. The first graph representation 400 also includes memory element nodes 420 and 426, and intermediate node 424. The second graph representation 402 includes input nodes 430 and 432 and output nodes 434 and 436. The second graph representation 402 also includes memory element nodes 440 and 444, and intermediate node 442. In a particular embodiment, the first and second graph representations 400 and 402 can be created in accordance with the method described above with respect to FIG. 2.

As illustrated, a label (N1, N2, N3, N4, N5, N6, N7, and N8) is associated with each of the input, output, intermediate points and memory element nodes of the first and second graph representations 402 and 404. Some of these labels can be assigned in an initialization procedure, while the remaining labels can be calculated in an iterative fashion as described above with respect to FIG. 3. For example, the input node 410 can be assigned a label N1, while the memory element node 420 is calculated to have N5.

The memory element labels associated with the memory element nodes and intermediate nodes of the first and second graph representations 402 and 404 can be used to determine correspondences between the graph representations. For example, the values for different memory element nodes can be compared to determine which memory element nodes correspond to each other. In the illustrated particular embodiment, the memory element nodes 420 and 440 are associated with the memory element label N5. This indicates that the memory elements associated with these memory element nodes correspond to each other. Thus, by comparing the memory element labels to find correspondences in the graph representations 400 and 402, correspondences between the memory elements of the circuit design models associated with the graph representations can also be located. The same procedure can be followed to find intermediate point correspondence between the circuit design models associated with the graph representations.

In addition, the graph representations 400 and 402 can be compared to locate potential errors in the circuit design models. For example, as illustrated, the label for intermediate node 424 does not correspond to any value in the second graph representation 402. This can indicate that an error is present in either circuit design model associated with the graph representations 400 and 402.

It will be appreciated that the methods described herein, including the method described with respect to FIG. 4, may be implemented as, for example, a computer readable medium that embodies executable instructions that manipulate a processor or other computation system to perform the functions described herein.

Figure 5:
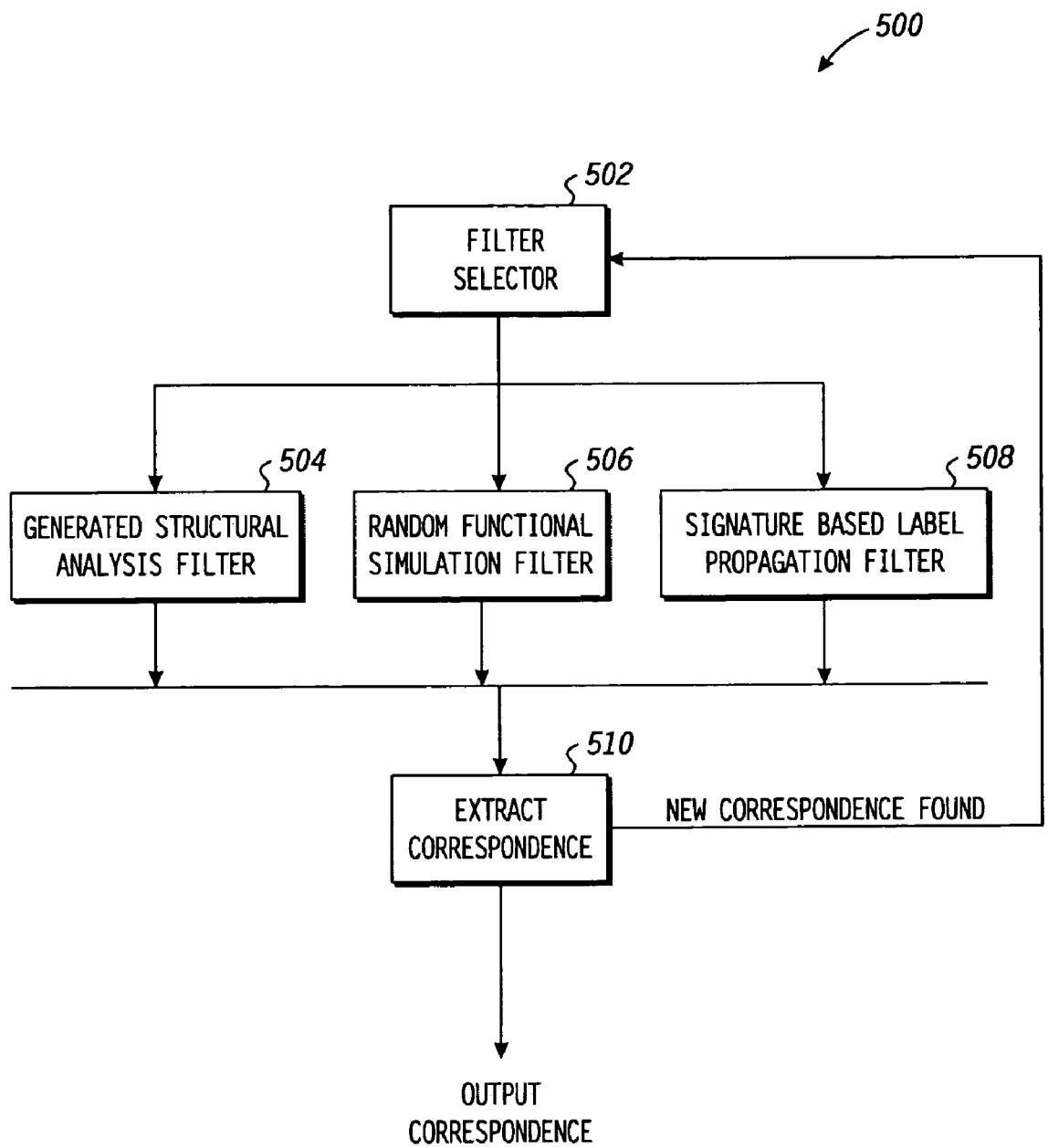
FIG. 5 is a diagram of a particular embodiment of a device for determining memory element or intermediate point correspondence between circuit design models using different techniques.

Referring to FIG. 5, a device 500 for finding correspondences between circuit design models is illustrated. The device 500 may be implemented in hardware, firmware, software, or a combination thereof. The device 500 includes a design model correspondence filter selector 502. The device 500 also includes a plurality of design model correspondence filters, including a structural analysis filter 504, a random functional simulation filter 506, and a signature based propagation filter 508. The design model correspondence filters are responsive to the filter selector 502. The device 500 further includes a correspondence extractor 510, which is responsive to each of the design model correspondence filters.

During operation, the filter selector 502 selects one or more of the design model correspondence filters to perform correspondence operations on two or more design models. The filter selector 502 can send the design models, or data based on the design models, to the design model correspondence filters and request a correspondence operation.

Each of the design model correspondence filters can determine correspondence in different ways. The structural analysis filter 504 can analyze the design models and determine correspondence based on certain structural factors. For example, the structural analysis filter 504 can determine correspondences between elements of the design models based on similarities in the number of inputs and outputs for each element, their cycle lengths, depth from inputs and outputs, and other factors. The random functional simulation filter 506 can determine correspondences between design models by identifying functional similarities in the design model elements based on application of random inputs to the model and then comparing the values on the intermediate points and memory elements in different circuit models. The signature based label propagation filter 508 can determine correspondences based on labels assigned to input and output nodes of the design models. For example, the signature based label propagation filter can determine correspondences in accordance with the methods described above with respect to FIGS. 2, 3 and 4.

The design model correspondence filters can send identified correspondences to the correspondence extractor 510. The correspondence extractor 510 can use this data to perform a variety of functions. For example, the correspondence extractor 510 can compare correspondence data from different design model correspondence filters to ensure that the data is consistent. This can result in a more robust determination of correspondences. In case of inconsistent data, the correspondence extractor can decide which correspondence to keep based on statistical data, user provided ranking or other criteria.

In addition, the correspondence extractor 510 can send identified correspondences to the filter selector 502. The filter selector 502 can then select one or more of the design model correspondence filters and send the identified correspondences to the selected filters. The selected filters can use the identified correspondences to find additional correspondences between circuit design models. For example, the signature based label propagation filter 508 can assign unique labels to the nodes associated with the identified corresponding memory elements, and calculate additional memory element labels, in accordance with the methods described in FIGS. 3 and 4.

Accordingly, by iteratively performing correspondence analysis, and by using different correspondence analysis filters, the ability to detect correspondences, as well as circuit design model errors, is enhanced.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. A method comprising:
    associating at a processor a first label to a first vertex associated with a first circuit design model, wherein the first vertex is representative of a first circuit element of the first circuit design model;
    associating at the processor a first set of labels to a plurality of input and output nodes associated with the first circuit design model, wherein the plurality of input and output nodes is representative of a first set of inputs and outputs of the first circuit design model;
    associating at the processor a second set of labels to a plurality of vertices associated with the first circuit design model, wherein the plurality of vertices is associated with a plurality of circuit elements coupled to the first circuit element of the first circuit design model;
    determining at the processor a second label for the first vertex based on the first set of labels and the second set of labels; and
    determining at the processor a first correspondence between the first circuit design model and a second circuit design model based on the second label for the first vertex;
    associating at the processor a third label to a second vertex associated with the second circuit design model, wherein the second vertex is representative of a first circuit element of the second circuit design model;
    associating at the processor the first set of labels to a plurality of input and output nodes associated with the second circuit design model, wherein the plurality of input and output nodes is representative of a set of inputs and outputs of the second circuit design model;
    associating at the processor a third set of labels to a plurality of vertices associated with the second circuit design model, wherein the plurality of vertices is associated with a plurality of circuit elements coupled to the first circuit element of the second circuit design model;
    determining at the processor a fourth label for the second vertex based on the first set of labels and the third set of labels;
    wherein the first correspondence between the first circuit design model and the second circuit design model is further based on the fourth label.

2. The method of claim 1, further comprising:
    associating at the processor a third label to an edge between the first vertex and one of the plurality of vertices, associated with the first circuit design model, wherein the edge is representative of a logic path between the first circuit element and a second circuit element of the first circuit design model;
    wherein the second label is further based on the third label.

3. The method of claim 2, wherein the third label is based on a direction of the logic path.

4. The method of claim 1, further comprising:
    associating at the processor a third label to the first vertex based on the first correspondence.

5. The method of claim 4, wherein the third label is a prime number.

6. The method of claim 4, further comprising:
    determining at the processor a label for a second vertex of the first circuit design model based on the third label and the first set of labels.

7. The method of claim 1, wherein the first circuit element is a storage element of the first circuit design model.

8. The method of claim 1, wherein the first circuit element is an intermediate point of the first circuit design model.

9. The method of claim 1, wherein the first circuit model is selected from the group consisting of a Register Transfer Level (RTL) model, a transistor circuit level model, and a gate level model.

10. The method of claim 1, further comprising:
    determining at the processor an Nth set of labels for the first set of vertices by iteratively calculating N sets of labels for the first set of vertices, wherein the Nth set of labels is calculated based on the first set of labels and the N−1 set of labels.

11. The method of claim 10, further comprising:
    a) determining at the processor an N+1th set of labels for the first set of vertices by iteratively calculating N+1 sets of labels for the first set of vertices, wherein the N+1th set of labels is calculated based on the first set of labels and the Nth set of labels;
    b) detecting at the processor a match between the N+1th set of labels to the Nth set of labels;
    c) incrementing N; and
    d) repeating a) through c) until a predetermined number of matches have been detected.

12. The method of claim 1, further comprising:
    generating at the processor the first set of vertices based on a data file associated with the first circuit design model;
    generating at the processor the plurality of input and output nodes based on the data file.

13. A computer readable medium tangibly embodying a program of instructions to be executed by a processor, the program of instructions comprising:
    instructions to associate a first label to a first vertex associated with a first circuit design model, wherein the first vertex is representative of a first circuit element of the first circuit design model;
    instructions to associate a first set of labels to a plurality of input and output nodes associated with the first circuit design model, wherein the plurality of input and output nodes is representative of a first set of inputs and outputs of the first circuit design model;
    instructions to associate a second set of labels to a plurality of vertices associated with the first circuit design model, wherein the plurality of vertices is associated with a plurality of circuit elements coupled to the first circuit element of the first circuit design model;

instructions to determine a second label for the first vertex based on the first set of labels and the second set of labels; and instructions to determine a first correspondence between the first circuit design model and a second circuit design model based on the second label for the first vertex;

instructions to associate a third label to a second vertex associated with the second circuit design model, wherein the second vertex is representative of a first circuit element of the second circuit design model;

instructions to associate the first set of labels to a plurality of input and output nodes associated with the second circuit design model, wherein the plurality of input and output nodes is representative of a set of inputs and outputs of the second circuit design model;

instructions to associate a third set of labels to a plurality of vertices associated with the second circuit design model, wherein the plurality of vertices is associated with a plurality of circuit elements coupled to the first circuit element of the second circuit design model;

instructions to determine a fourth label for the second vertex based on the first set of labels and the third set of labels; and wherein the first correspondence between the first circuit design model and the second circuit design model is further based on the second label and the fourth label.

14. The computer readable medium of claim 13, further comprising:

instructions to associate a third label to an edge between the first vertex and one of the plurality of vertices, associated with the first circuit design model, wherein the edge is representative of a logic path between the first circuit element and a second circuit element of the first circuit design model;

wherein the second label is further based on the third label.

15. The computer readable medium of claim 14, wherein the third label is based on a direction of the logic path.

16. The computer readable medium of claim 13, further comprising:

instructions to associate a third label to the first vertex based on the first correspondence.

17. The computer readable medium of claim 16, wherein the third label is a prime number.

18. The computer readable medium of claim 16, further comprising:

instructions to determine a label for a second vertex of the first circuit design model based on the third label and the first set of labels.

* * * * *